(12) United States Patent
Hsu et al.

(10) Patent No.: US 9,337,225 B2
(45) Date of Patent: May 10, 2016

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Hung-Wen Hsu, Tainan (TW); Jung-I Lin, Hsinchu (TW); Ching-Chung Su, Tainan (TW); Jiech-Fun Lu, Tainan County (TW); Yeur-Luen Tu, Taichung (TW); Chia-Shiung Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/026,141

(22) Filed: Sep. 13, 2013

(65) Prior Publication Data
US 2015/0076646 A1    Mar. 19, 2015

(51) Int. Cl.
*H01L 27/146* (2006.01)

(52) U.S. Cl.
CPC ...... *H01L 27/14623* (2013.01); *H01L 27/1464* (2013.01); *H01L 27/14643* (2013.01); *H01L 27/14685* (2013.01)

(58) Field of Classification Search
CPC ............... H01L 27/1464; H01L 27/14623; H01L 27/307; H01L 27/3234
See application file for complete search history.

(56) References Cited

U.S. PATENT DOCUMENTS

| | | | | |
|---|---|---|---|---|
| 3,969,751 A | * | 7/1976 | Drukaroff et al. | 257/435 |
| RE44,376 E | * | 7/2013 | Shiau et al. | 438/45 |
| 8,610,230 B1 | * | 12/2013 | Nian et al. | 257/437 |
| 8,628,990 B1 | * | 1/2014 | Wu et al. | 438/48 |
| 8,928,120 B1 | * | 1/2015 | Liu et al. | 257/619 |

(Continued)

FOREIGN PATENT DOCUMENTS

KR    2011-0000891    1/2011

OTHER PUBLICATIONS

Schulz L. G. "Optical Constants of Silver, Gold, Copper, and Aluminum. II. The Index of Refraction n" Jour. Opt. Soc. Amer. vol. 44, No. 5 May 1954 pp. 362-368.*

(Continued)

*Primary Examiner* — Matthew Landau
*Assistant Examiner* — Grant Withers
(74) *Attorney, Agent, or Firm* — WPAT, P.C., Intellectual Property Attorneys; Anthony King

(57) ABSTRACT

A backside illumination semiconductor image sensing device includes a semiconductor substrate. The semiconductor substrate includes a radiation sensitive diode and a peripheral region. The peripheral region is proximal to a sidewall of the backside illumination semiconductor image sensing device. The backside illumination semiconductor image sensing device further includes a first anti reflective coating (ARC) on a backside of the semiconductor substrate and a dielectric layer on the first anti reflective coating. Additionally, a radiation shielding layer is disposed on the dielectric layer. Moreover, the backside illumination semiconductor image sensing device has a photon blocking layer on the sidewall of the backside illumination semiconductor image sensing device. The at least a portion of a sidewall of the radiation shielding layer is not covered by the photon blocking layer and the photon blocking layer is configured to block photons penetrating into the semiconductor substrate.

19 Claims, 8 Drawing Sheets

(56) References Cited

U.S. PATENT DOCUMENTS

| | | | |
|---|---|---|---|
| 2006/0208285 A1* | 9/2006 | Inoue et al. | 257/239 |
| 2008/0237766 A1* | 10/2008 | Kim | 257/432 |
| 2009/0200586 A1* | 8/2009 | Mao et al. | 257/292 |
| 2009/0230488 A1* | 9/2009 | Ando | 257/432 |
| 2010/0244287 A1* | 9/2010 | Hsu | G03F 7/70633 257/797 |
| 2010/0248414 A1* | 9/2010 | Liu et al. | 438/70 |
| 2011/0101430 A1* | 5/2011 | Lee | 257/292 |
| 2011/0186951 A1* | 8/2011 | Pyo | 257/432 |
| 2011/0227138 A1* | 9/2011 | Haddad et al. | 257/291 |
| 2011/0241148 A1* | 10/2011 | Hiyama et al. | 257/435 |
| 2011/0298000 A1* | 12/2011 | Liu et al. | 257/99 |
| 2012/0001286 A1* | 1/2012 | Yoon | 257/432 |
| 2012/0007198 A1* | 1/2012 | Lin et al. | 257/432 |
| 2012/0056288 A1* | 3/2012 | Yoshihara et al. | 257/431 |
| 2012/0175722 A1* | 7/2012 | Tai et al. | 257/447 |
| 2012/0187516 A1* | 7/2012 | Sato | 257/443 |
| 2012/0199882 A1* | 8/2012 | Shin | 257/222 |
| 2012/0211849 A1* | 8/2012 | Matsugai | 257/432 |
| 2012/0248580 A1* | 10/2012 | Matsugai et al. | 257/621 |
| 2012/0261781 A1* | 10/2012 | Hsu et al. | 257/432 |
| 2012/0313208 A1* | 12/2012 | Kim et al. | 257/435 |
| 2013/0032916 A1* | 2/2013 | Lin et al. | 257/435 |
| 2013/0037902 A1* | 2/2013 | Nakazawa et al. | 257/432 |
| 2013/0084660 A1* | 4/2013 | Lu et al. | 438/14 |
| 2013/0119500 A1* | 5/2013 | Weng et al. | 257/435 |
| 2013/0235243 A1* | 9/2013 | Sano et al. | 348/308 |
| 2013/0256824 A1* | 10/2013 | Mizuta et al. | 257/459 |
| 2013/0299886 A1* | 11/2013 | Chuang et al. | 257/292 |
| 2013/0320562 A1* | 12/2013 | Miyajima | 257/774 |
| 2013/0329102 A1* | 12/2013 | Tsao et al. | 348/294 |
| 2013/0334577 A1* | 12/2013 | Ahn | 257/222 |
| 2014/0061839 A1* | 3/2014 | Ting et al. | 257/435 |
| 2014/0061842 A1* | 3/2014 | Ting et al. | 257/448 |
| 2014/0145282 A1* | 5/2014 | Shen et al. | 257/432 |
| 2014/0167197 A1* | 6/2014 | JangJian et al. | 257/437 |
| 2014/0183681 A1* | 7/2014 | JangJian et al. | 257/437 |
| 2014/0217486 A1* | 8/2014 | Akiyama | 257/294 |
| 2014/0252523 A1* | 9/2014 | Chuang et al. | 257/432 |
| 2014/0263958 A1* | 9/2014 | Her et al. | 250/208.1 |
| 2014/0263962 A1* | 9/2014 | Ahn et al. | 250/208.1 |
| 2014/0264701 A1* | 9/2014 | Tai et al. | 257/435 |
| 2014/0264719 A1* | 9/2014 | Chou et al. | 257/506 |
| 2015/0001682 A1* | 1/2015 | Liu et al. | 257/619 |

OTHER PUBLICATIONS

Synowiki, R. "Refractive Index Measurements of Photoresist and Antireflective Coatings with Variable Angle Spectroscopic Ellipsometry" Proc. SPIE 3332 Feb. 22, 1998 pp. 384-390.*

Turbadar, T. "Complete Absorption of Light by Thin Metal Films" Proc. Phys. Soc. vol. 73, No. 1 Jan. 1, 1959 pp. 40-44.*

Office action and Search Report dated Nov. 26, 2015 from the Korea counterpart application 10-2014-0121119.

English translation of the Office action dated Nov. 26, 2015 from the Korea counterpart application 10-2014-0121119.

English abstract translation of KR2011-0000891.

* cited by examiner

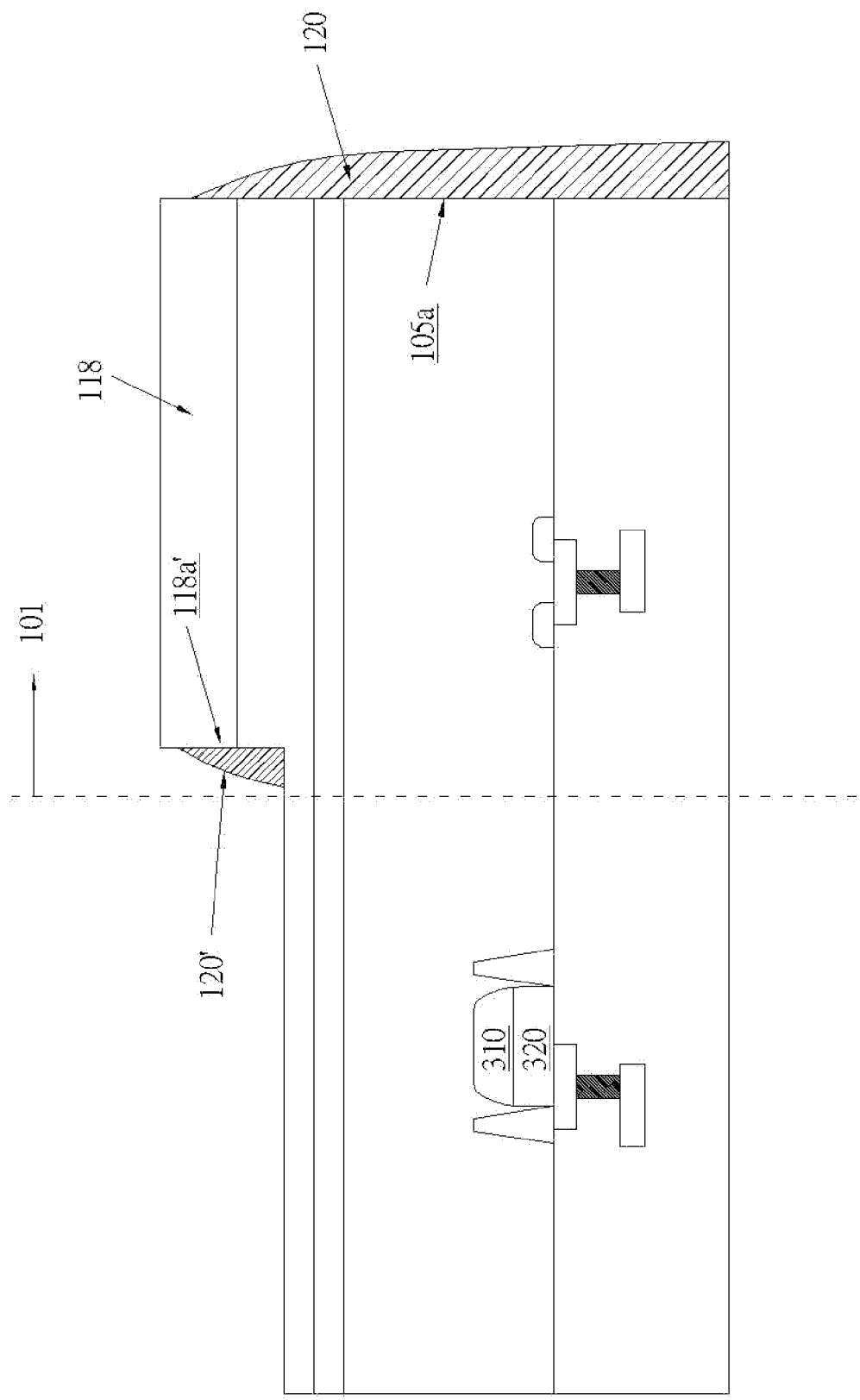

SEMICONDUCTOR DEVICE AND MANUFACTURING METHOD THEREOF

FIELD

The present disclosure relates to a semiconductor device and a manufacturing method thereof.

BACKGROUND

Semiconductor image sensors are used to sense radiation such as lights. Complementary metal-oxide-semiconductor (CMOS) image sensors (CIS) are widely used in various applications such as digital camera or mobile phone camera. These devices utilize an array of pixels located in a substrate, including photodiodes and transistors that can absorb radiation projected toward the substrate and convert the sensed radiation into electrical signals.

A back side illuminated (BSI) image sensor device is one type of image sensor device. These BSI image sensor devices detect lights projected from the backside. A BSI image sensor device has a relatively thin silicon substrate (e.g., a few microns thick) in which light-sensing pixels are formed. The quantum efficiency and the well capacity of the BSI image sensors depend on the size of the radiation-sensing region. The BSI image sensor device has an image sensing grid and a reference pixel normally located around the image sensing grid.

Interference to the reference pixel from ambient environment needs to be reduced in order to achieve a better performance. Noise to the reference pixel becomes an issue to improve the accuracy of the BSI image sensor device.

BRIEF DESCRIPTION OF THE DRAWINGS

Aspects of the present disclosure are described with reference to the accompanying figures. It is emphasized that, in accordance with the standard practice in the industry, various features are not drawn to scale. In fact, the dimensions of the various features may be arbitrarily increased or reduced for clarity of discussion.

FIG. 6A to 6G are cross sectional views of a method in manufacturing a semiconductor image sensing device in accordance with some embodiments of the present disclosure.

DETAILED DESCRIPTION OF THE INVENTION

The making and using of various embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

In the present disclosure, an extra film or spacer is designed to reduce photons penetrating into reference pixel in an image sensing device, in some embodiments, the image sensing device is a back side illumination (BSI) CMOS. The reference pixel is located proximal to an edge of the image sensing device and surrounds active pixels. In some embodiments, the reference pixel is in a peripheral region. In some embodiments, the extra film or spacer is disposed on the edge to block foreign photons from entering the reference.

According to some embodiments of the present disclosure, dark current of the image sensing device is reduced by disposing the extra film or spacer on a sidewall of the reference pixel; wherein the sidewall is also the edge of the image sensing device. The dark current is reduced because foreign photons are blocked by the extra film or spacer.

Figure 1A:
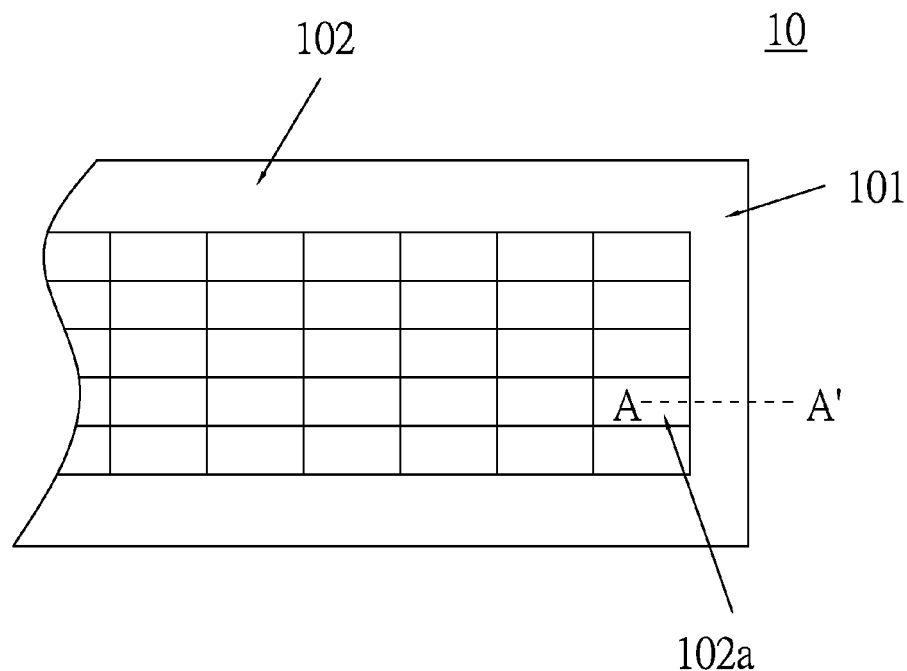
FIG. 1A is a top view of an image sensing device in accordance with some embodiments of the present disclosure.
Figure 1B:
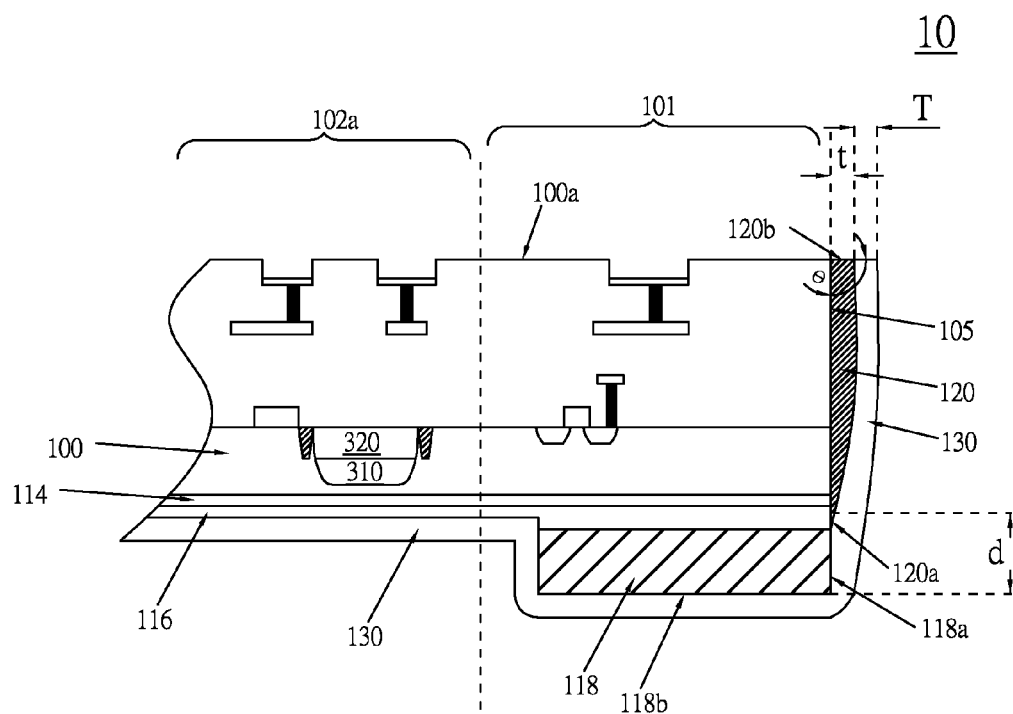
FIG. 1B is a cross sectional view of a portion of the image sensing device in FIG. 1A in accordance with some embodiments of the present disclosure.

FIG. 1A is a top view of an image sensing device 10 and FIG. 1B is a cross sectional perspective drawing along AA' in FIG. 1A. The image sensing device 10 has a pixel grid 102 that includes several imaging sensing pixels with identical structure. Imaging sensing pixel 102a is used as an example herein after for a better understanding of detail of an imaging sensing pixel. The grid 102 is surrounded by a peripheral region 101. In some embodiments, peripheral region 101 is arranged at an edge of the image sensing device. In some embodiments, the peripheral region is surrounded by some control or A/D conversion circuitry.

As in FIG. 1B, imaging sensing pixel 102a and peripheral region 101 are in a same substrate 100. "Substrate" herein refers to a bulk substrate on which various layers and device structure are formed. In some embodiments, the bulk substrate includes silicon or a compound semiconductor, such as Ga As, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits. As in FIG. 1B, a doped region 310 with a first conductivity type and a doped region 320 with a second conductivity type are located in the substrate 100. More particular, doped region 310 and doped region 320 together form a radiation sensitive diode in the sensing pixel. On the other portion of the substrate 100, some devices such as a MOS transistor 305 and interconnection 315 are located in the peripheral region 101. In some embodiments, the substrate is a semiconductor epitaxial layer. Substrate 100 has a front side 100a and a back side 100b.

In comparison with the image sensing pixel 102a, peripheral region 101 is proximal to a sidewall 105 of the image sensing device. Peripheral region 101 includes a top surface projected from backside 100b of the semiconductor substrate 100 and sidewall 105 is coplanar with a sidewall of the semiconductor substrate 100. The sidewall 105 is perpendicular to the top surface. Pixel 102a includes a photo diode 120 to capture photons and covert into electric signals. In some embodiments as in FIG. 1B, the imaging sensing device is designed as a back side illumination image sensing device, hence photons are guided to penetrate into the substrate 100 through backside 101b. In some embodiments, the imaging sensing pixel further includes a CMOS circuitry to convert photons into electric signals.

On the backside 100b, an anti reflective coating layer 114 is disposed thereon. The anti reflective coating layer 114 covers both imaging sensing pixel 102a and peripheral region 101. Anti reflective coating is a type of optical coating applied to the surface of imaging sensing device to reduce reflection. This improves the efficiency of the device since less light is lost. In some embodiments, the anti reflective coating layer 114 includes silicon oxynitride, silicon nitride, silicon carbide, silicon oxycarbide, tantalum oxide. In some embodiments, the anti reflective coating layer 114 has a thickness between about 300 A and about 1500 A. In some embodiments, anti reflective coating layer 114 has a reflective index between about 1.35 and about 2.65. In some embodiments, anti reflective coating layer 114 has a reflective index between about 1.8 and about 2.5. In some embodiments, thickness of anti reflective coating layer is uniform above imaging sensing pixel and peripheral region. In some embodiments, a thickness of anti reflective coating layer above imaging sensing pixel is different to a thickness on peripheral region.

A dielectric layer 116 is disposed on the anti reflective coating layer 114. The dielectric layer 116 covers on both imaging sensing pixel 102a and peripheral region 101. In some embodiments, a thickness of the dielectric layer 116 on the imaging sensing pixel 102a is thinner than a thickness of the dielectric layer 116 on the peripheral region 101. In some embodiments, the dielectric layer includes materials such as $SiO_y$, $SiN_y$, $SiC_y$, $SiON_y$, $TaO_y$, $AlO_y$, $HfO_y$. In some embodiments, the dielectric layer has a thickness between about 300 A and about 1200 A. In some embodiments, the dielectric layer is a composite structure including at least two different materials. In some embodiments, thickness of dielectric layer is uniform above imaging sensing pixel and peripheral region. In some embodiments, a thickness of dielectric layer above the imaging sensing pixel is different to a thickness on the peripheral region.

In some embodiments, an extra film is disposed on a portion of the backside 100b, substantially on a top surface of the peripheral region 101. The extra film includes a radiation shielding layer 118 to prevent photons entering into the substrate 100 located in the peripheral region 101. The radiation shielding layer 118 includes materials such as a metal, metal alloy, metal compound, metal oxide, or the like. In some embodiments, the radiation shielding layer 118 includes materials such as Pt, AlCu, TiN, Au, Ti, Ta, TaN, W, WN, Cu, and combination thereof. In some embodiments, the radiation shielding layer 118 includes materials such as $MgO_x$, $AlO_x$, $TiO_x$, $CrO_x$, $MnO_x$, $FeO_x$, $CoO_x$, $NiO_x$, $CuO_x$, $ZnO_x$, $GeO_x$, $YO_x$, $ZrO_x$, $NbO_x$, $MoO_x$, $SnO_x$, $LaO_x$, $HfO_x$, $TaO_x$, $WO_x$, $CeO_x$, $GdOx$, $YbO_x$, and $LuO_x$.

In contrast to imaging sensing pixel, the peripheral region is configured to be isolated from foreign photons. In some embodiments, the peripheral region is a pixel configured as a reference for the adjacent imaging sensing pixel. The radiation shielding layer 118 on top of the peripheral region 101 as shown in FIG. 1B prevents foreign photons from entering into the semiconductor substrate 100 through backside 100b. Thus, interference is reduced.

Another feature in the present disclosure as in FIG. 1B is to have a photon blocking layer 120 on a sidewall 105 of the image sensing device 10. The photon blocking layer 120 is used to prevent foreign photons from penetrating into the semiconductor substrate 100 through sidewall 105. In some embodiments, the photon blocking layer 120 is substantially on a sidewall of the semiconductor substrate 100. In some embodiments, the photon blocking layer 120 also covers at least a portion of a top surface of radiation shielding layer 118.

In some embodiments, the photon blocking layer 120 includes various materials. In some embodiments, the photon blocking layer 120 includes silicon nitride. In some embodiments, the photon blocking layer 120 includes silicon oxynitride. In some embodiments, the photon blocking layer 120 includes silicon oxide. In some embodiments, the photon blocking layer 120 includes metal, such as Pt, AlCu, TiN, Au, Ti, Ta, TaN, W, WN, Cu. In some embodiments, the photon blocking layer 120 includes metal alloy. In some embodiments, the photon blocking layer 120 includes metal oxide such as $MgO_x$, $AlO_x$, $TiO_x$, $CrO_x$, $MnO_x$, $FeO_x$, $CoO_x$, $NiO_x$, $CuO_x$, $ZnO_x$, $GeO_x$, $YO_x$, $ZrO_x$, $NbO_x$, $MoO_x$, $SnO_x$, $LaO_x$, $HfO_x$, $TaO_x$, $WO_x$, $CeO_x$, $GdOx$, $YbO_x$, and $LuO_x$.

In some embodiments, the photon blocking layer is designed as a composite film. A photon blocking layer includes at least two layers that are different in properties such as thickness, reflective index, wet etch rate, etc. In some embodiments, a photon blocking layer includes a metal layer on the sidewall 105 as in FIG. 1B and a silicon nitride layer adjacent to the metal layer. In some embodiments, a photon blocking layer includes a silicon oxide layer on the sidewall 105 and a silicon nitride layer adjacent to the silicon oxide layer. In some embodiments, a photon blocking layer includes a silicon oxynitride layer on the sidewall 105 and a silicon nitride layer adjacent to the silicon oxynitride layer. In some embodiments, a photon blocking layer includes a silicon nitride layer on the sidewall 105 and a silicon oxide layer adjacent to the silicon nitride layer.

Referring to FIG. 1B, in some embodiments, the photon blocking layer 120 covers a sidewall of the anti reflective coating 114 and a portion of a sidewall of the dielectric layer 116. Sidewall 118a of the radiation shielding layer 118 is not covered by photon blocking layer 120. In some embodiments, the photon blocking layer 120 at least covers a sidewall of the anti reflective coating 114 and sidewall 105 of semiconductor substrate 100. In some embodiments, which are not shown in FIG. 1B, the photon blocking layer extends further to cover a portion of a sidewall 118a of the radiation shielding layer. In some embodiments, at least a portion of sidewall 118a is not covered by the photon blocking layer 120. In some embodiments, there is a distance d between tip of an end 120a of the photon blocking layer 120 and the top surface 118b of radiation shielding layer 118. In some embodiments, the distance d is about 300 Å. In some embodiments, the distance d is about 400 Å. In some embodiments, the distance d is about 500 Å. In some embodiments, the distance d is between about 300 Å and about 500 Å.

The photon blocking layer 120 has a reflective index between about 500 A and 1500 A. In some embodiments, there is a reflective index ratio between the photon blocking layer 120 and the anti reflective coating layer 114. In some embodiments, the reflective index ration between the photon blocking layer 120 and the anti reflective coating layer 114 is between about 0.8 and 1.0. In some embodiments, the reflective index ration between the photon blocking layer 120 and the anti reflective coating layer 114 is between about 0.8 and 1.2. In some embodiments, the reflective index ration between the photon blocking layer 120 and the anti reflective coating layer 114 is between about 0.75 and 1.1.

The photon blocking layer in the present disclosure is designed to have various shapes and features. In some embodiments as in FIG. 1B, photon blocking layer 120 is designed as a "spacer". As used herein, a "spacer" recited in the present disclosure refers to structures surrounding a protrusion positioned on a surface and contacting the sidewall of said protrusion. The spacer is used to seclude a portion of the protrusion from the adjacent elements on the surface. A "spacer" usually has an end with curved surface and a wider base at the other end.

In FIG. 1B, photon blocking layer 120 surrounds the peripheral region 101 and is in contact with sidewall 105 as a spacer of the BSI image sensing device 10. The photon blocking layer 120 has an end 120a with curved surface and a base 120b, which has a thickness t. The base 120b is approximately coplanar with front side 100a of the BSI image sensing device 10. In some embodiments, thickness t is designed to be greater than about 800 Å. In some embodiments, thickness t is greater than about 1000 Å. In some embodiments, thickness t is greater than about 1500 Å. In some embodiments, thickness t is less than about 4000 Å. In some embodiments, photon blocking layer does not have a sharp end or a curved surface as in FIG. 1B. In some embodiments, the photon blocking layer has a substantially uniform thickness along sidewall 105 of peripheral region 101.

Sidewall 105 of the BSI image sensing device 10 and the base 120b of the photon blocking layer 120 has an angle θ. The angle θ is determined by a preceding operation, such as an etching operation to forms the sidewall 105. In some embodiments, the angle θ is substantially around 90 degrees. In some embodiments, the angle θ is smaller than 90 degrees. In some embodiments, the angle θ is greater than 90 degrees. When the angle θ is smaller than 90 degrees, less foreign photons are expected to penetrate through sidewall 105 and enter into the peripheral region 101. Thus, thickness t of the photon blocking layer can be designed to be thinner. In some embodiments, thickness t is between about 800 Å and 1200 Å while the angle θ is between about 80 and 90 degrees. In some embodiments, thickness t is between about 800 Å and 2000 Å while the angle θ is about 90 degrees. In some embodiments, thickness t is between about 1500 Å and 3500 Å while the angle θ is between about 90 and 105 degrees. In some embodiments, thickness t is between about 800 Å and 4000 Å while the angle θ is between about 80 and 105 degrees.

In some embodiments, there is a composite film stack attached on sidewall of semiconductor substrate. As in FIG. 1B, an anti reflective coating 130 is disposed to cover the photon blocking layer 120 to form a composite structure on sidewall 105 of substrate 100. The anti reflective coating 130 also extends to cover the radiation shielding layer 118 and top surface of the image sensing pixel 102a. In some embodiments, the reflective coating 130 covers the whole top surface of radiation sensitive pixel grid 102 as in FIG. 1a. The anti reflective coating 130 has a thickness T at one end coplanar with base 120b. In some embodiments, thickness T is about 2000 Å. In some embodiments, a ratio between thickness t and thickness T is about 0.5. In some embodiments, a ratio between thickness t and thickness T is about 2.0. In some embodiments, a ratio between thickness t and thickness T is between about 0.5 and about 2.0. Other ratios are within the contemplated scope of the present disclosure. In some embodiments, the anti reflective coating 130 includes a same material as that in anti reflective coating 114. In some embodiments, the anti reflective coating 130 includes a different material as that in anti reflective coating 114.

In some embodiments, there is a reflective index ratio between the photon blocking layer 120 and the anti reflective coating layer 130. In some embodiments, the reflective index ration between the photon blocking layer 120 and the anti reflective coating layer 130 is between about 0.8 and 1.0. In some embodiments, the reflective index ration between the photon blocking layer 120 and the anti reflective coating layer 130 is between about 0.8 and 1.2. In some embodiments, the reflective index ration between the photon blocking layer 120 and the anti reflective coating layer 130 is between about 0.75 and 1.1.

Figure 2:
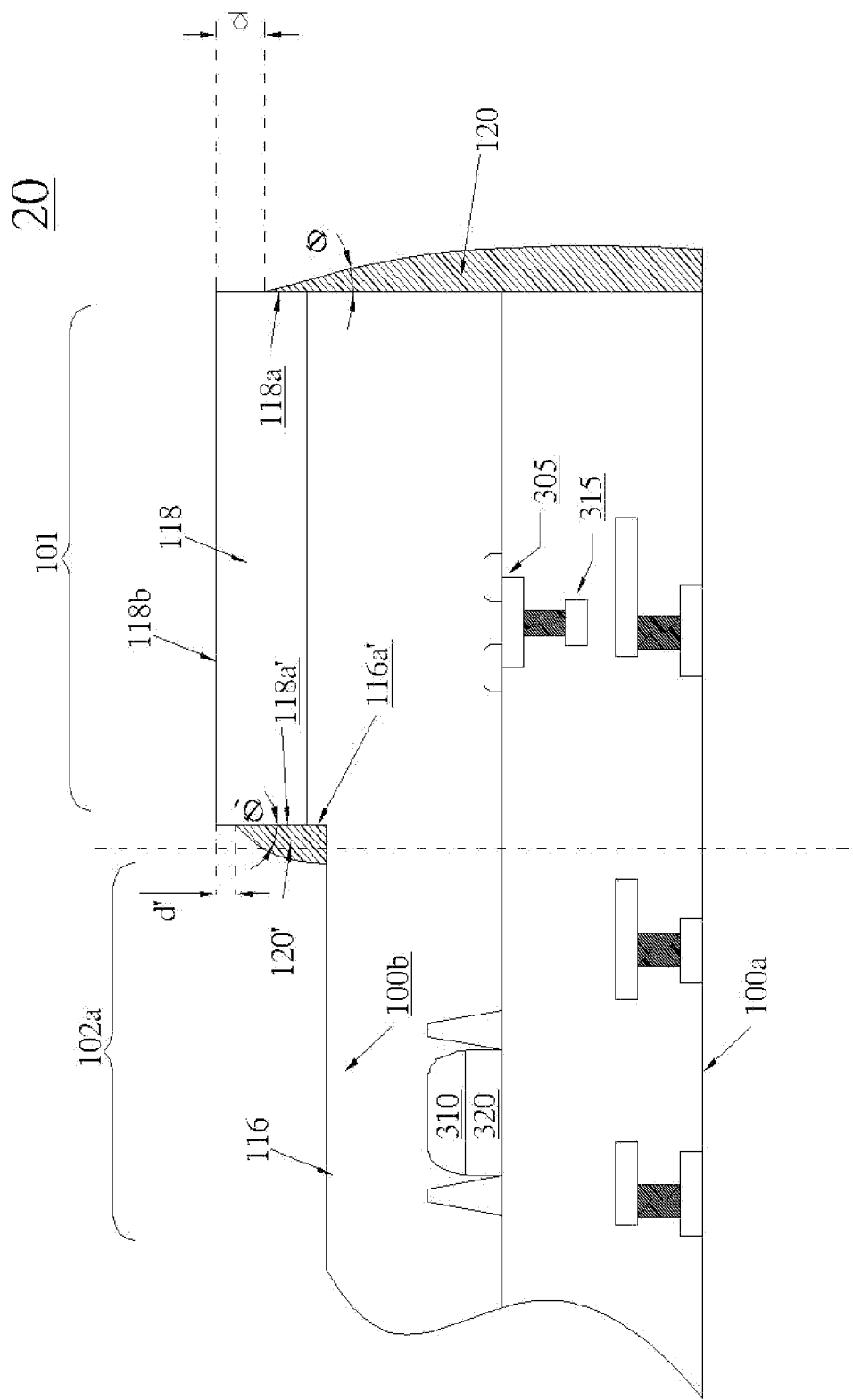
FIG. 2 is a cross sectional view of an image sensing device as in FIG. 1A in accordance with some embodiments of the present disclosure.

FIG. 2 is a cross sectional view of a backside illumination (BSI) semiconductor image sensing device 20. Elements with same labeling numbers as those in FIG. 1B are previously discussed with reference thereto and are not repeated here for simplicity. In FIG. 2, the photon blocking layer 120 covers sidewall of dielectric layer 116 and a portion of sidewall 118a of the radiation shielding layer 118. The BSI semiconductor image sensing device 20 further includes a photon blocking layer 120' as a spacer on another sidewall 118a' of the radiation shielding layer 118. Sidewall 118a' is opposite to sidewall 118a and is proximal to the image sensing pixel 102a, which is located in a radiation sensitive pixel grid. The photon blocking layer 120' also covers another sidewall 116a' of dielectric layer 116. In some embodiments, photon blocking layer 120 only covers sidewall 116a and leaves sidewall 118a uncovered; and photon blocking layer 120' only covers sidewall 116a' and leaves sidewall 118a' uncovered. In some embodiments, there is a distance d' between tip of the photon blocking layer 120' and top surface 118b of the radiation shielding layer 118. In some embodiments, the distance d' is substantially equal to distance d. In other words, tip of photon blocking layer 120 and tip of photon blocking layer 120' are substantially at a same level. In some embodiment, the distance d' is about 300 Å. In some embodiments, the distance d' is about 400 Å. In some embodiments, the distance d' is about 500 Å. In some embodiments, the distance d' is between about 300 Å and about 500 Å.

Tip of the photon blocking layer 120' has an angle Φ'. In some embodiments, the angle Φ' is substantially equal to an angle Φ of the photon blocking layer 120. In some embodiments, angle Φ and/or Φ' is between about 5 and about 10 degrees. In some embodiments, angle Φ and/or Φ' is between about 5 and about 25 degrees. In some embodiments, angle Φ and/or Φ' is between about 5 and about 45 degrees. In some embodiments, angle Φ and/or Φ' is between about 5 and about 85 degrees. In some embodiments, angle Φ and/or Φ' is between about 5 and about 90 degrees.

In some embodiments, the photon blocking layer 120' includes materials that are identical to the photon blocking layer 120. In some embodiments, the photon blocking layer 120' includes materials that are different to the photon blocking layer 120. In some embodiments, the photon blocking layer 120' includes structures that are identical to the photon blocking layer 120. In some embodiments, the photon blocking layer 120' includes structures that are different to the photon blocking layer 120.

Figure 3:
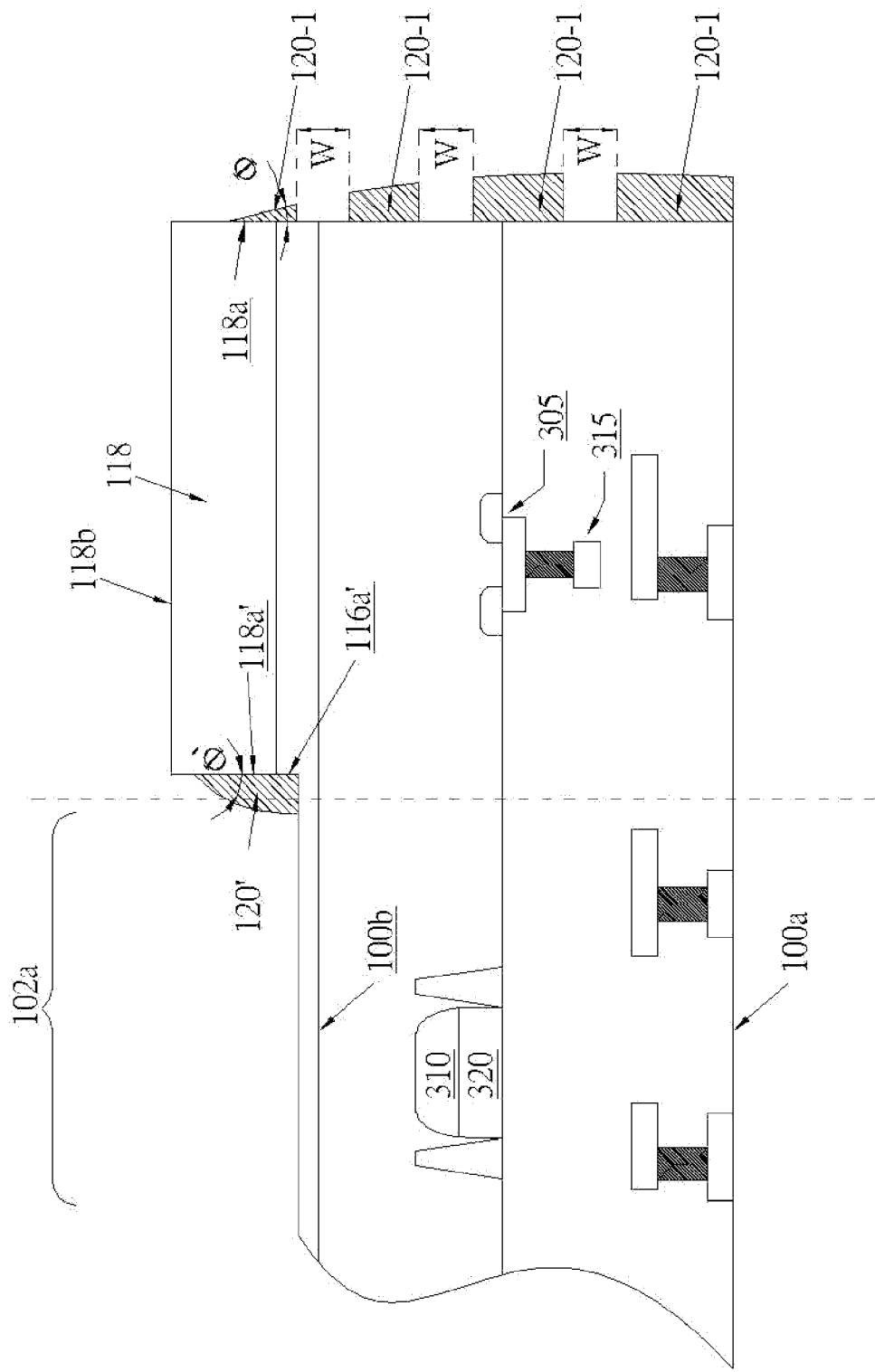
FIG. 3 is a cross sectional view of an image sensing device which has a divided photon blocking layer in accordance with some embodiments of the present disclosure.
Figure 4:
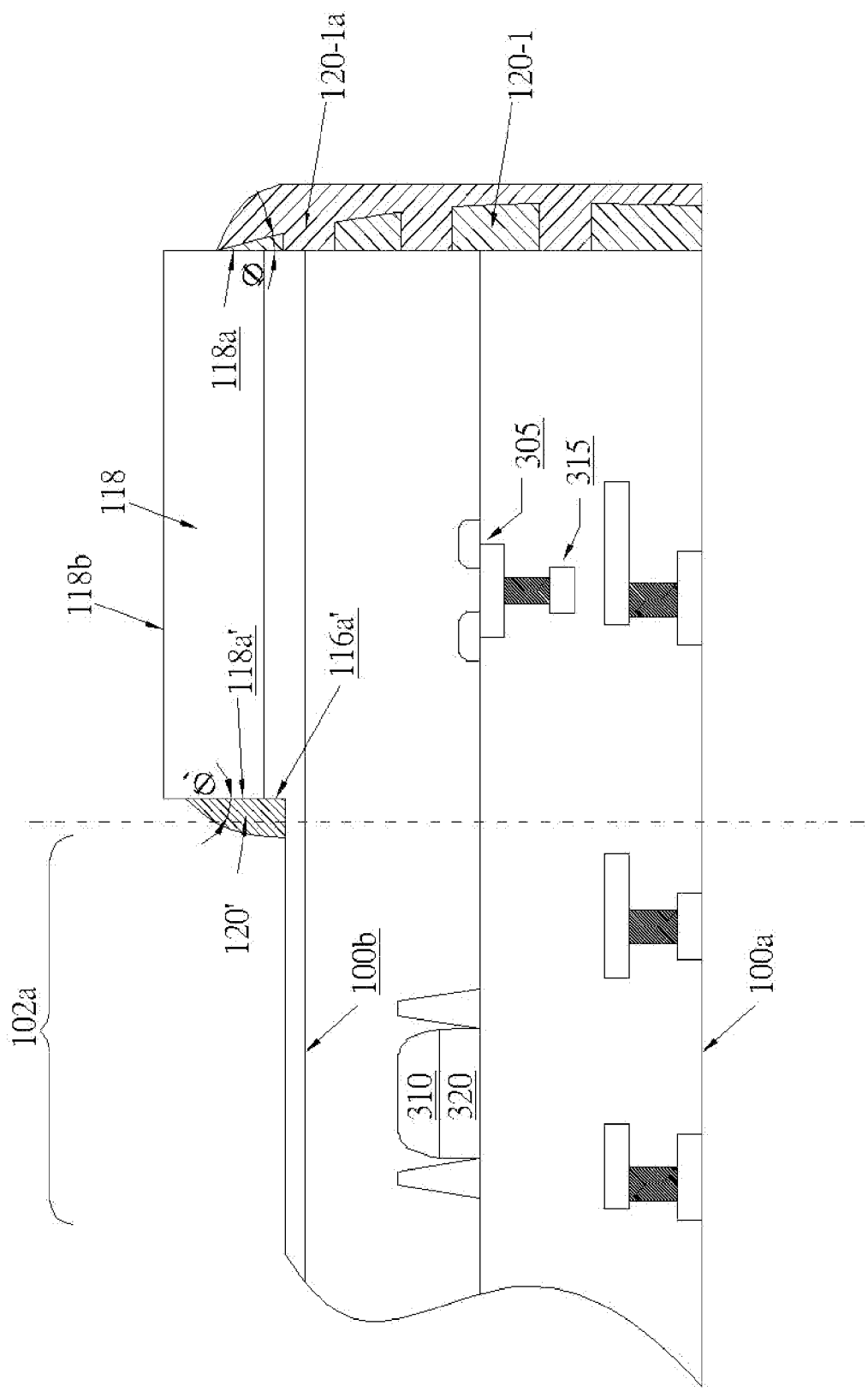
FIG. 4 is a cross sectional view of an image sensing device which has a composite photon blocking layer in accordance with some embodiments of the present disclosure.

In some embodiments, a photon blocking layer is designed to have several sections. As in FIG. 3, a semiconductor image sensing device 30 has a divided photon blocking layer 120-1. Elements with same labeling numbers as those in FIG. 1B are previously discussed with reference thereto and are not repeated here for simplicity. The photon blocking layer 120-1 is adjacent to sidewall 105 and separated into several sections. In some embodiments, each section is separated with an equal gap w. In some embodiments, gap w between adjacent sections is not equal. In some embodiments as in FIG. 4, an additional photon blocking layer 120-1a is disposed to cover the divided photon blocking layer 120-1, thus to form a composite film. In some embodiments, the additional photon blocking layer 120-1a also covers another photon blocking layer 120'.

Methods of forming a semiconductor image sensing device are realized by various processes. In the present disclosure, semiconductor processes such as diffusion, photolithography, chemical vapor deposition (CVD), physical vapor deposition (PVD), electroplating, chemical mechanical planarization (CMP), etching, ion implantation are adopted but should not be deemed as a limitation. The methods include a number of operations and the description and illustration are not deemed as a limitation as the order of the operations.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HD-PCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

A term "patterning" or "patterned" is used in the present disclosure to describe an operation of forming a predetermined pattern on a surface. The patterning operation includes various steps and processes and varies in accordance with the features of embodiments. In some embodiments, a patterning operation is adopted to pattern an existing film or layer. The patterning operation includes forming a mask on the existing film or layer and removing the unmasked film or layer with an etch or other removal process. The mask is a photo resist, or a hardmask. In some embodiments, a patterning operation is adopted to form a patterned layer directly on a surface. The patterning operation includes forming a photosensitive film on the surface, conducting a photolithography process and a developing process. The remaining photosensitive film is retained and integrated into the 3D semiconductor structure.

A term "plating" or "plated" is used in the present disclosure to describe an operation of forming a film or a layer on a surface. The plating operation includes various steps and processes and varies in accordance with the features of embodiments. The film or layer been plated on the surface is a single film or a composite stack. In some embodiments, a plating operation is adopted to form a metallic film. In some embodiments, a plating operation includes forming a seed layer and electroplating a metallic film on the seed layer. In some embodiments, a plating operation includes a vapor deposition process. In some embodiments, a plating operation includes a sputtering process.

Figure 5:
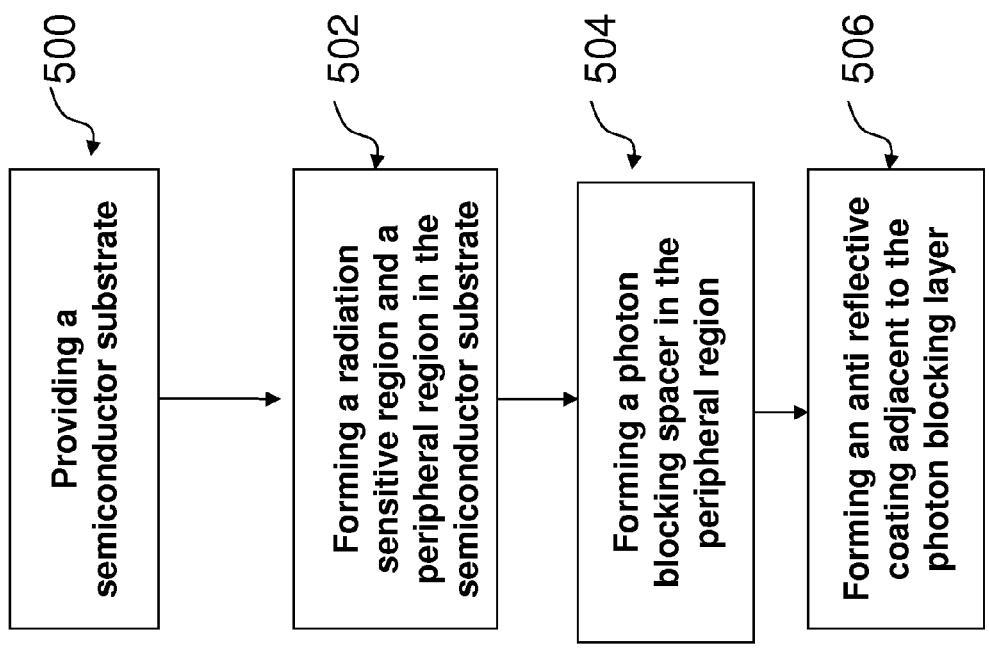
FIG. 5 is flowchart of method in manufacturing a semiconductor image sensing device in accordance with some embodiments of the present disclosure.

FIG. 5 is a flowchart of method 50 in manufacturing a semiconductor image sensing device. In operation 500, a semiconductor substrate is provided. In operation 502, a radiation sensitive region and a peripheral region are formed in the semiconductor substrate. In operation 504, a photon blocking layer or spacer is formed in the peripheral region. In operation 506, an anti reflective coating adjacent to the photon blocking layer is formed.

Figure 6A:
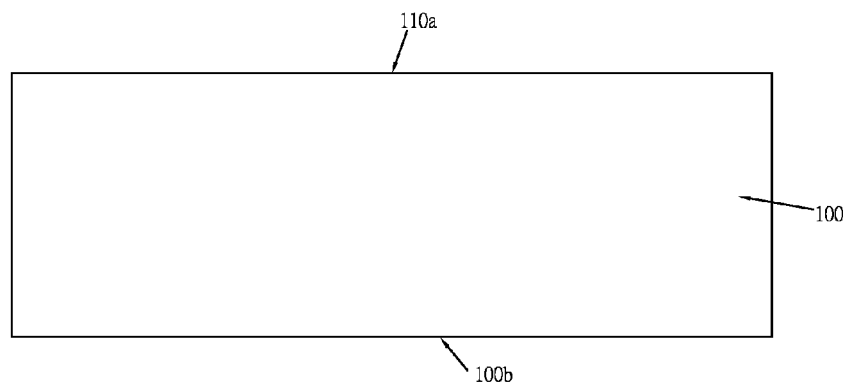
Figure 6B:
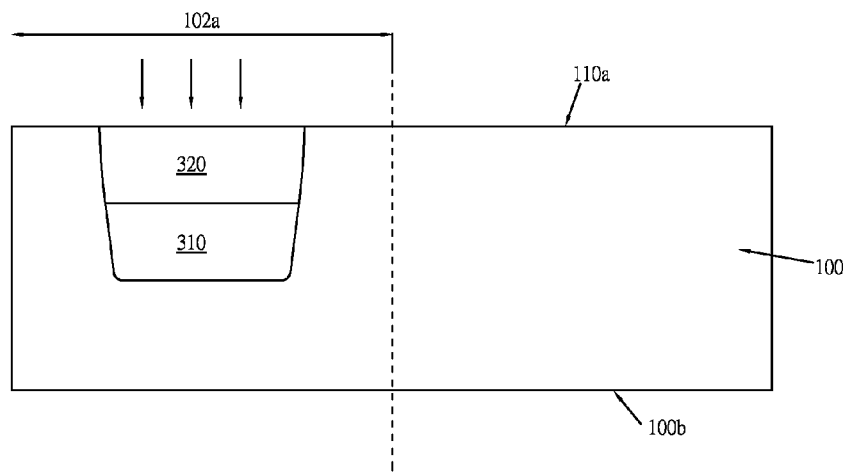

FIG. 6A to 6G are cross sectional views of a method in manufacturing a semiconductor image sensing device. Elements with same labeling numbers as those in FIGS. 1 to 4 are previously discussed with reference thereto and are not repeated here for simplicity. In FIG. 6A, a semiconductor substrate 100 is provided. The semiconductor substrate 100 has a front surface 110a and a back side 100b. Some doped regions such as 310 and 320 are formed in an image sensing pixel 102a as shown in FIG. 6B. The doped regions act as a radiation sensitive diode. In some embodiments, the doped regions are formed by ion implantation and thermal diffusion drive-in. In some embodiments, doped region 310 is firstly formed in a deeper distance from the front surface 110a by a high voltage ion implantation. Doped region 310 is of a first conductivity type. The doped region 320 is formed after doped region 310 and in a shallower distance from the front surface 110a. The doped region 320 is of a second conductivity type which is opposite to the first conductive type, thus to form a diode.

Some devices such as isolations like shallow trench isolation, LOCOS, doped regions like source/drain are also formed in the substrate. In some embodiments, those devices are formed before or after the diode formed in the image sensing pixel 102a. Some metallization or MOS structures are formed later on the front side 100a. Some dielectric films or passivation layers are disposed thereon to protect the circuitry on the front side 100a.

Figure 6C:
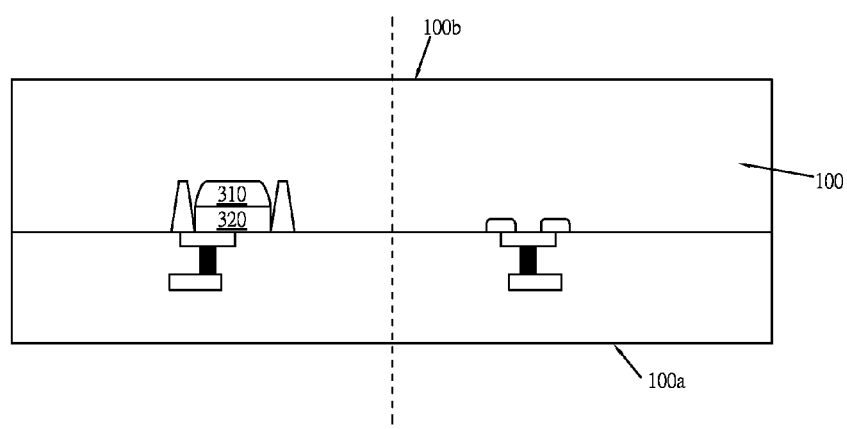

In FIG. 6C, the substrate 100, including other structures on the front surface 110a to form a front side 100a, is reverted to expose the back side 100b in order to form a back side illumination imaging sensing device. In some embodiments, the back side 100b is further ground thus the substrate has a predetermined thickness. The front side 100a is bonded to a carrier or tape for the proceeding operations. In some embodiments, the front side 100a is bonded to a wafer substrate. In some embodiments, the front side 100a is bonded to an ASIC wafer.

Figure 6D:
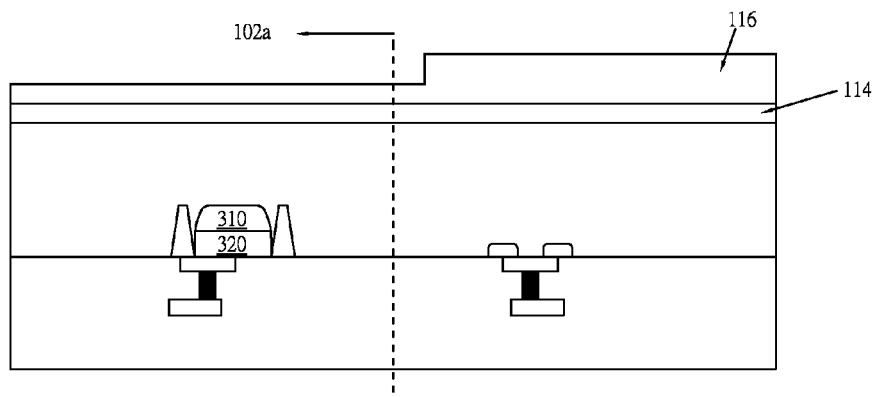

In FIG. 6D, an anti reflective layer 114 is deposited on back side 100b of the substrate. A dielectric layer 116 is formed on the anti reflective layer 114. In some embodiments as in FIG. 6D, the dielectric layer 116 has a step surface, which has a recess on the image sensing pixel 102a side.

Figure 6E:
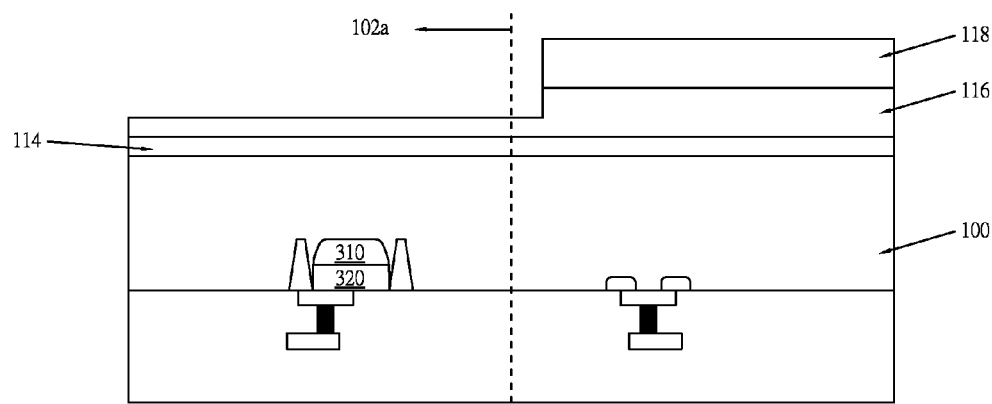
Figure 6F:
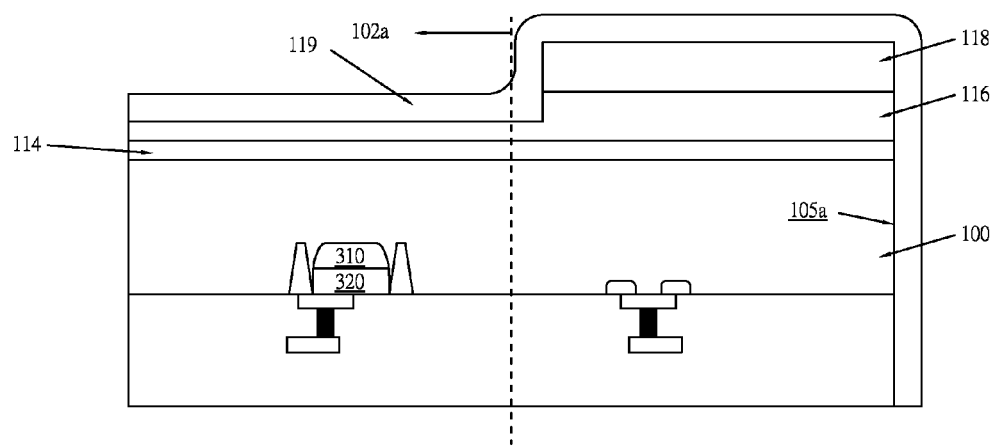

In FIG. 6E, a radiation shielding layer 118 is formed on the dielectric layer 116. In some embodiments as in FIG. 6E, the radiation shielding layer 118 does not cover the dielectric layer 116 on the image sensing pixel 102a side. In FIG. 6F, a photon blocking material 119 is deposited on a top surface of the radiation shielding layer 118 and the dielectric 116. The photon blocking material 119 further extends to cover a sidewall 105a of the substrate 100. In some embodiments, a photon blocking material 119 is formed in a CVD chamber. The photon blocking material 119 is formed in a temperature between about 300 C and about 450 C.

In FIG. 6G, an etch operation is introduced to remove a portion of photon blocking material and leaving a sidewall of the peripheral region 101 covered by the photon blocking material. A spacer-like photon blocking layer 120 is formed on the sidewall 105a. Another spacer-like photon blocking layer 120' is also formed on a sidewall 118a' of the metal shielding layer 118. In some embodiments, photon blocking material is removed to leave only the photon blocking layer 120 without photon blocking layer 120' on sidewall 118a'.

A second anti-reflective coating (not shown) is formed after the spacer-like photon blocking layer formed. The anti-reflective coating is formed to cover spacer-like photon blocking layer in order to have a composite structure at sidewall 105. In some embodiments, forming the photon blocking material and forming the second anti reflective coating are conducted by a same process. In some embodiments, forming photon blocking material and forming second anti reflective coating are conducted in a same type of tool. In some embodiments, both photon blocking material and second anti reflective coating are formed by a plasma enhanced CVD process.

A backside illumination semiconductor image sensing device includes a semiconductor substrate. The semiconductor substrate includes a radiation sensitive diode and a peripheral region. The peripheral region is proximal to a sidewall of the backside illumination semiconductor image sensing device. The backside illumination semiconductor image sensing device further includes a first anti reflective coating (ARC) on a backside of the semiconductor substrate and a dielectric layer on the first anti reflective coating. Additionally, a radiation shielding layer is disposed on the dielectric layer. Moreover, the backside illumination semiconductor image sensing device has a photon blocking layer on the sidewall of the of the backside illumination semiconductor image sensing device. The at least a portion of a sidewall of the radiation shielding layer is not covered by the photon blocking layer and the photon blocking layer is configured to block photons penetrating into the semiconductor substrate.

A backside illumination semiconductor image sensing device has a photon blocking layer on the sidewall of the of the backside illumination semiconductor image sensing device and the photon blocking layer is between about 1000 Å and about 4000 Å.

A backside illumination semiconductor image sensing device has a photon blocking layer and a second anti reflective coating. The second anti reflective coating is adjacent to the photon blocking layer.

A backside illumination semiconductor image sensing device has a second anti reflective coating. The second anti reflective coating has a thickness about 2000 Å.

A backside illumination semiconductor image sensing device has a photon blocking layer and the photon blocking layer includes silicon nitride, silicon oxide, metal, metal alloy, or combinations thereof.

A semiconductor image sensing device includes a radiation sensitive grid and the radiation sensitive grid includes a plurality of image sensing pixels. The semiconductor image sensing device includes a peripheral region surrounding the radiation sensitive grid, wherein the peripheral region includes a radiation shielding layer on a top surface of the peripheral region. The semiconductor image sensing device includes a photon blocking layer disposed on a portion of a first sidewall of the peripheral region. The semiconductor image sensing device further includes an anti reflective coating covering the photon blocking layer and a top surface of the radiation sensitive grid.

A semiconductor image sensing device includes a photon blocking layer and the photon blocking layer is disposed on a portion of a second sidewall of the peripheral region and the second sidewall is opposite to the first sidewall. The second sidewall is proximal to a radiation sensitive grid in the semiconductor image sensing device.

A semiconductor image sensing device includes a photon blocking layer and an anti reflective coating covering a sidewall of the photon blocking layer. A thickness of the photon blocking layer is between about 0.5 and about 2 times of a thickness of the anti reflective coating.

A semiconductor image sensing device includes a radiation sensitive grid and the radiation sensitive grid includes a plurality of image sensing pixels. The semiconductor image sensing device includes a peripheral region surrounding the radiation sensitive grid, wherein the peripheral region includes a radiation shielding layer on a top surface of the peripheral region. The semiconductor image sensing device includes a photon blocking layer disposed on a portion of a first sidewall of the peripheral region. The semiconductor image sensing device further includes an anti reflective coating covering the photon blocking layer and a top surface of the radiation sensitive grid. One end of the photon blocking layer is near a top surface of the radiation shielding layer and the end is below the top surface of the radiation shielding layer between about 300 Å and 500 Å.

A method of forming a semiconductor image sensing device includes providing a semiconductor substrate. The method includes forming a radiation sensitive region and a peripheral region in the semiconductor substrate, wherein the peripheral region surrounds the radiation sensitive region. The method includes forming a photon blocking spacer of the peripheral region. The method further includes forming an anti reflective coating adjacent to the photon blocking layer.

Although the present invention and its advantages have been described in detail, it should be understood that various changes, substitutions and alterations cancan be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A backside illumination (BSI) semiconductor image sensing device, comprising:
   a semiconductor substrate including an image sensing pixel region and an adjacent peripheral region, wherein the peripheral region is proximal to a sidewall of the backside illumination semiconductor image sensing device;
   a first anti reflective coating (ARC) on a backside of the semiconductor substrate;
   a dielectric layer on the first anti reflective coating;
   a radiation shielding layer on the dielectric layer in the peripheral region; and
   a photon blocking layer on the sidewall of the backside illumination semiconductor image sensing device and covering a portion of a sidewall of the radiation shielding layer while contacting with the sidewall of the radiation shielding layer, the sidewall of the radiation shielding layer not abutting the dielectric layer and forming a corner with the dielectric layer, and the photon blocking layer being configured to block photons penetrating into the semiconductor substrate;
   wherein an end of the photon blocking layer includes an arc.

2. The semiconductor image sensing device of claim 1, wherein a portion of a second sidewall of the radiation shielding layer is covered by a second photon blocking layer, the second sidewall of the radiation shielding layer being opposite to the sidewall of the radiation shielding layer.

3. The semiconductor image sensing device of claim 1, wherein the photon blocking layer has a thickness between about 1000 Å and about 4000 Å.

4. The semiconductor image sensing device of claim 1, further comprising an angle between the sidewall of the substrate and a front side of the substrate, wherein the angle is equal or greater than 90 degrees.

5. The semiconductor image sensing device of claim 1, further comprising a second anti reflective coating adjacent to the photon blocking layer.

6. The semiconductor image sensing device of claim 5, wherein the second anti reflective coating has a thickness about 2000 Å.

7. The semiconductor image sensing device of claim 5, wherein a refractive index ratio between the photon blocking layer and the second anti reflective coating layer is between about 0.8 and 1.2.

8. The semiconductor image sensing device of claim 1, wherein the photon blocking layer includes silicon nitride, silicon oxide, metal, metal alloy, or combinations thereof.

9. The semiconductor image sensing device of claim 1, wherein the photon blocking layer includes at least two layers differing in refractive index.

10. The semiconductor image sensing device of claim 1, wherein a tip of the photon blocking layer formed by the arc and a sidewall of the photon blocking layer adjacent to the sidewall of the backside illumination semiconductor image sensing device has an angle between about 5 degrees and about 85 degrees.

11. The semiconductor image sensing device of claim 1, wherein the end of the photon blocking layer including the arc is proximal to the backside of the semiconductor substrate.

12. A semiconductor image sensing device, comprising:
a radiation sensitive grid including a plurality of image sensing pixels;
a peripheral region surrounding the radiation sensitive grid;
a radiation shielding layer over a top surface of the peripheral region;
a photon blocking layer on a portion of a first sidewall of the peripheral region;
an anti reflective coating covering the photon blocking layer and a top surface of the radiation sensitive grid.

13. The semiconductor image sensing device of claim 12, wherein the photon blocking layer is formed on a portion of a second sidewall of the peripheral region and the second sidewall is opposite to the first sidewall.

14. The semiconductor image sensing device of claim 13, wherein the second sidewall is proximal to the radiation sensitive grid.

15. The semiconductor image sensing device of claim 12, wherein the radiation sensitive grid includes a semiconductor transistor and a photo diode.

16. The semiconductor image sensing device of claim 12, wherein a thickness of the photon blocking layer is between about 0.5 and about 2 times of a thickness of the anti reflective coating.

17. The semiconductor image sensing device of claim 12, wherein a refractive index of the anti reflective coating is between about 1.8 and about 2.5, and a refractive index of the photon blocking layer is between about 1.8 and about 2.5.

18. The semiconductor image sensing device of claim 12, wherein one end of the photon blocking layer is near a top surface of the radiation shielding layer and the end is below the top surface of the radiation shielding layer by between about 300 Å and 500 Å.

19. The semiconductor image sensing device of claim 12, wherein the photon blocking layer has a base on one end, and an angle between the base of the photon blocking layer and the first sidewall of the peripheral region is substantially equal to or greater than about 90 degrees.

* * * * *